US009407210B2

(12) United States Patent (10) Patent No.: US 9,407,210 B2
Komiak (45) Date of Patent: Aug. 2, 2016

(54) CASCODE POWER AMPLIFIER

(71) Applicant: BAE Systems Information and Electronic Systems Integration Inc., Nashua, NH (US)

(72) Inventor: James J. Komiak, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/803,693

(22) Filed: Jul. 20, 2015

(65) Prior Publication Data

US 2015/0326188 A1    Nov. 12, 2015

Related U.S. Application Data

(62) Division of application No. 14/028,844, filed on Sep. 17, 2013, now Pat. No. 9,118,284.

(60) Provisional application No. 61/701,888, filed on Sep. 17, 2012.

(51) Int. Cl.
*H03F 1/22* (2006.01)
*H03F 3/193* (2006.01)
*H03F 3/21* (2006.01)
*H01L 23/66* (2006.01)
*H03F 3/60* (2006.01)

(52) U.S. Cl.
CPC ............... *H03F 1/223* (2013.01); *H01L 23/66* (2013.01); *H03F 3/193* (2013.01); *H03F 3/21* (2013.01); *H03F 3/601* (2013.01); *H01L 2924/0002* (2013.01); *H03F 2200/12* (2013.01); *H03F 2200/121* (2013.01); *H03F 2200/21* (2013.01); *H03F 2200/36* (2013.01); *H03F 2200/543* (2013.01); *H03F 2200/75* (2013.01)

(58) Field of Classification Search
CPC ........................................................ H03F 1/22
USPC .................................................. 330/310, 311
See application file for complete search history.

(56) References Cited

U.S. PATENT DOCUMENTS

| | | | |
|---|---|---|---|
| 4,901,032 A | 2/1990 | Komiak | |
| 6,801,098 B2 | 10/2004 | Ozawa et al. | |
| 7,242,253 B2 * | 7/2007 | Motta | H03F 1/22 330/311 |
| 7,755,435 B2 * | 7/2010 | Lu | H03F 1/223 330/311 |
| 7,936,210 B2 * | 5/2011 | Robinson | H03F 3/607 327/566 |
| 8,665,022 B2 * | 3/2014 | Kobayashi | H03F 1/233 330/266 |
| 8,786,368 B2 * | 7/2014 | Benson | H03F 1/086 330/286 |
| 2009/0121791 A1 * | 5/2009 | Lu | H03F 1/223 330/311 |

* cited by examiner

*Primary Examiner* — Henry Choe
(74) *Attorney, Agent, or Firm* — Daniel J. Long; Sand & Sebolt, LPA

(57) ABSTRACT

An amplifier for amplifying signals is presented. A cascode power amplifies includes two or more adjacent cascode amplifiers and at least one remote cascode amplifier. The adjacent cascode amplifiers are lined up adjacent each other with inputs of the adjacent cascode amplifiers connected to a common input line and outputs of the of adjacent cascode amplifiers connected to a common output line. The adjacent cascode amplifiers generally operate in parallel. The remote cascode amplifier is spaced apart from the adjacent cascode amplifiers. An input transmission line connects an input of the remote cascode amplifier to the common input line. An output transmission line connects an output of the remote cascode amplifier to the common output line. Amplified outputs of the adjacent cascode amplifiers and amplified outputs of the remote cascode amplifier are power combined and summed into a coherent amplified output signal that is output on the output transmission line.

5 Claims, 4 Drawing Sheets

CASCODE POWER AMPLIFIER

CROSS REFERENCE TO RELATED APPLICATION

This is a divisional application of U.S. Ser. No. 14/028,844 filed Sep. 17, 2013 and claims priority from U.S. Provisional Application Ser. No. 61/701,888, filed Sep. 17, 2012; the disclosure of which is incorporated herein by reference.

BACKGROUND OF THE INVENTION

1. Field of Invention

The current invention relates generally to apparatus, systems and methods for amplifying a signal. More particularly, the apparatus, systems and methods relate to amplifying a radio frequency (RF) power signal. Specifically, the apparatus, systems and methods provide for a power amplifier that uses multiple cascode amplifiers some of which are grouped together and some of which are spaced apart.

2. Description of Related Art

Amplifiers have long been used to amplify a variety of electrical signals. For example, amplifiers can be used to amplify voltage, current, power and the like. Early amplifiers used vacuum tubes to amplify signals. These tubes where large, used high power and often burned out. The invention of the silicon transistor greatly improved amplifier technology and quickly led to the extinction of vacuum tubes. Silicon transistors were much smaller, cheaper, could be more easily mass produced and had a much longer life span than vacuum tubes. Additionally, transistors consume much less power and generate less heat than vacuum tubes.

Because of a transistors small size, it has allowed for more sophisticated amplifiers to be designed. For example, operational amplifiers (Op Amps) contain two or more stages of amplification each with their own bias schemes all implemented with transistors and other discrete components. Op Amps provide excellent common mode rejection so that just a signal of interest is amplified.

One conventional approach to amplifying radio frequencies (RF) is to use a cascade amplifier that has a common gate transistor and a common source transistor. However, these types of amplifiers often have a small operational bandwidth (BW) and cannot handle higher currents/power, Therefore, what is needed is a better amplifier.

SUMMARY

The preferred embodiment includes a cascade power amplifier (PA). The cascode PA is an RE power amplifier (PA) that includes two or more adjacent cascode amplifiers and at least one remote cascode amplifier. The adjacent cascode amplifiers are lined up adjacent each other with inputs of the adjacent cascade amplifiers connected to a common input line and outputs of the of adjacent cascode amplifiers connected to a common output line. The adjacent cascode amplifiers generally operate in parallel. The remote cascade amplifier is spaced apart from the adjacent cascode amplifiers. An input transmission line connects an input of the remote cascade amplifier to the input line and to the common input line. An output transmission line connects an output of the remote cascade amplifier to the output line and the common output line. Amplified outputs of the adjacent cascade amplifiers and amplified outputs of the remote cascade amplifier are all power combined and summed into a coherent amplified output signal that is output on the output transmission line.

BRIEF DESCRIPTION OF SEVERAL VIEWS OF THE DRAWINGS

One or more preferred embodiments that illustrate the best mode(s) are set forth in the drawings and in the following description. The appended claims particularly and distinctly point out and set forth the invention.

The accompanying drawings, which are incorporated in and constitute a part of the specification, illustrate various example methods, and other example embodiments of various aspects of the invention. It will be appreciated that the illustrated element boundaries (e.g., boxes, groups of boxes, or other shapes) in the figures represent one example of the boundaries. One of ordinary skin in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
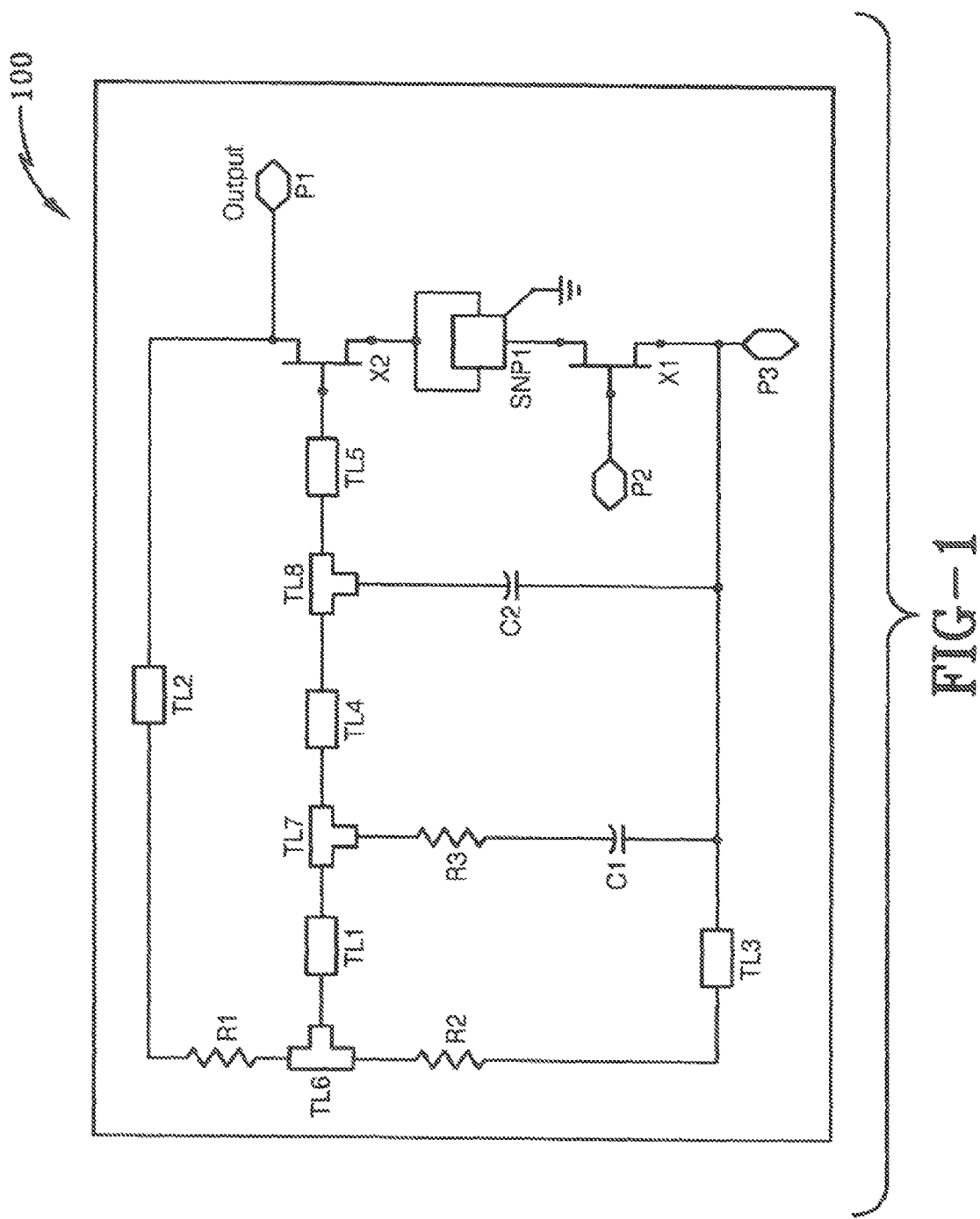
FIG. 1 illustrates an example schematic of a preferred embodiment of a cascode radio frequency (RF) power amplifier (PA).

FIG. 1 illustrates the preferred embodiment of a cascode Power Amplifier (PA) cell 100 that uses a compound transistor. The compound transistors include a common source transistor X1 and a common gate transistor X2. They are connected in series from a DC standpoint but in cascode configuration from an RF standpoint. The advantages to this compound transistor over a conventional single ended common source transistor is that first, it has a high efficiency. Secondly, it a higher voltage and lower current for a given power output which reduces certain power distribution loses both in the power module and in the chip itself due to reduced Ohmic losses operating at higher voltage and lower current. As a result of the higher voltage and lower current, a given power impedances are higher so that they can be matched over a wider bandwidth (BW).

The novelty of this embodiment of the PA cell 100 includes the bias network and how it stabilizes the cascade PA cell 100. The two left-hand biasing legs of FIG. 1 are the RF cascading and stabliization circuits. These two legs include R1-R3, C1, TL1, TL6 and TL7. There is a resistive voltage divider formed with resistors R1 and R2 connected to the common gate transistor X2 through a transmission line that sets the voltage of the compound transistor to half of Vdd across the common gate transistor X2 and half of Vdd across the common source transistor X1. There also is a series RC formed by resistor R3 and capacitor C1 combination that allows cascading grounding of the common gate of transistor X2, that is essentially an RE ground. Ideally, a large capacitor C1 is desired but this would require too much area and a small cascode cell is desired. Therefore, in the preferred embodiment C1 is still made as large as possible within a confined area and R3 is connected in series with it.

The common gate transistor X2 makes a very good oscillator configuration so stability can be controlled. The common gate transistor X2 has its source connected to the drain of the common source transistor X1 and its drain connected to the output P1 and resistor R1. Common source transistor X1 has its gate connected to RF ground (capacitor C2). The common transistor X1 has a gate connected to an input line and has its drain connected to resistor R2 and capacitors C1, C2 and has its source connected to ground.

In the preferred embodiment, the value of the components in FIG. 1 are now provided. R1 and R2 are each 5000 Ohms and have widths of 10 micro meters (um) and lengths of 123 um. Resistor R3 has a value of 320 Ohms, a width of 12.5 um and a length of 10 um. Capacitor C1 has a value of 1.0 pF and capacitor C2 has a value of 0.085 pF. Transmission line TL1 has a width of 8 um and a length of 155 um, transmission line 112 has a width of 15 um and a length of 105 um, transmission line TL3 has a width of 10 um and a length of 40 um, transmission line TL4 has a width of 8 um and a length of 185 um, transmission line TL5 has a width of 8 um and a length of 58 um. Transmission line T6 has a width W1 of 14, a width W2 of 14 um and a width W3 12 um, transmission line 17 has a width W1 of 10 um, a width W2 of 10 um, a W3 18 um and transmission line T8 has a with W1 of 14 um, a width W2 of 14 um and a width W3 12 um.

Figure 2:
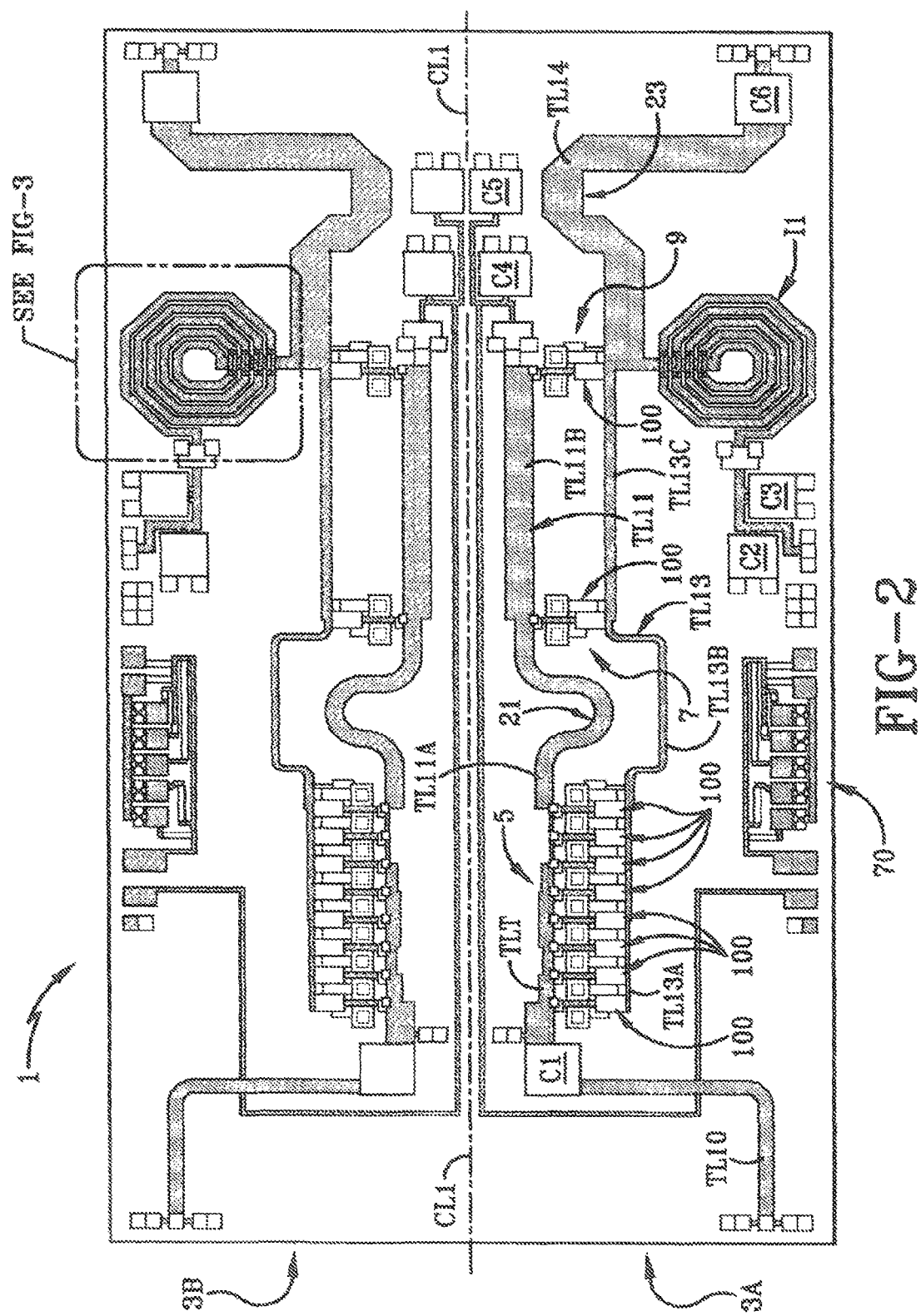
FIG. 2 illustrates an example view looking downward toward a gallium nitride (GaN) chip implementing a Non-uniform Distributed PA (NDPA).

FIG. 2 illustrates the preferred embodiment of how some components and cells are positioned and laid out on a Salt chip to create a RF PA. The chip can he implemented with GaN or with another type of semiconductor material as understood by one of ordinary skin in the art. FIG. 2, illustrates both halves 3A, 3B of cascaded RF PA 1 that is symmetrical about centerline CL1 that cuts the RF PA 1 into two halves 3A, 3B. Because it has a lot of symmetry, only one half 3A will be described and that description and labeling will equally apply to the second half 3B. The PA 1 is a non-uniform distributed PA for two reasons, First the widths of the transmission lines are different resulting in different impedances. Secondly, it is non-uniform because the cascode cells 100 are distributed with a duster eight cascode cells 5 (e.g., eight amplifiers 100) clumped together at one location and with two other cascode cells 7, 9 distributed remotely away from the cluster of eight 5.

The RF input enters the Non-uniform Distributed PA (NDPA) transmission line TL10 before passing by capacitor C1 and onto a tapered transmission line TLT connected to the bank of eight cascaded cells 5 (e.g., eighth amplifiers 100). Transmission line TLT is generally tapered so that it becomes smaller in width until the last cascode amplifier 100 of the cluster of eight cascaded cells 5 receives the RF input signal.

Transmission line TL11 is formed with transmission lines TL11A and TL11B. Transmission line TL11A is connected to the end of the tapered transmission line TLT and is also connected to the remote cascade amplifier 7. Transmission line TL11A includes a generally semicircle portion 21 that is included to increase the length of transmission line TL11 to make it a proper length. Transmission line TL11B is connected between remote cascade amplifier 7 and remote cascade amplifier 9. Transmission line TL11B is straight between remote cascade amplifier 7 and remote cascade amplifier 9 and has a constant width between these two amplifiers.

Transmission line 13 is formed with transmission lines TL13A-C. Transmission line 13A is connected to the outputs of the cluster of eight cascaded cells 5. This transmission line TL13A is slightly tapered beginning at the first cascade amplifier 100 of the bank of eight cascaded cells 5 until it reaches the last cell 100 of the bank of cascaded cells 5. Transmission line TL13B is connected to transmission line TL13A at the last cell 100 of the bank of cascaded cells 5 and transmission line TL13B is routed from here to the output of remote cascade amplifier 7. This transmission line TL13B is jogged way from transmission line 11A for shielding reasons. Transmission line 13C is connected between the outputs of remote cascade amplifier 7 and remote cascade amplifier 9. This transmission line 13C is straight with a constant width.

Output transmission line TL14 is connected between the output of remote cascade amplifier 9 and an output capacitor C6. it is also connected to a biasing inductor I1. This transmission line TL14 includes a somewhat semicircular portion 23 that extends its length a desired amount for optimal operation. Bias inductor I1 is connected/wired to capacitors C2 and C3. The mirrored cacsode RF PA 1 contains other capacitors C4, C5 and other components that are not discussed in detail here as they are not the primary novelty of the preferred embodiment of the cascade RF PA 1.

Figure 3:
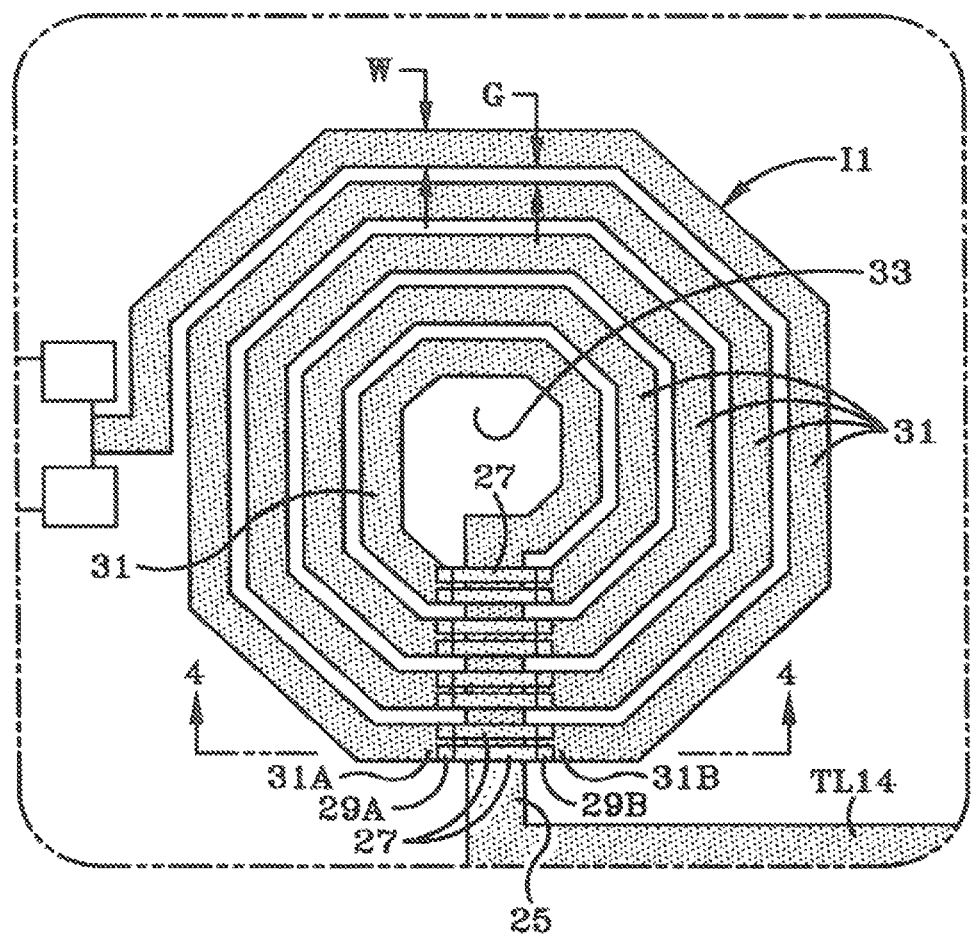
FIG. 3 illustrates an example top view a preferred embodiment of a bias inductor formed in a metal layer and with air bridge connector devices.
Figure 4:
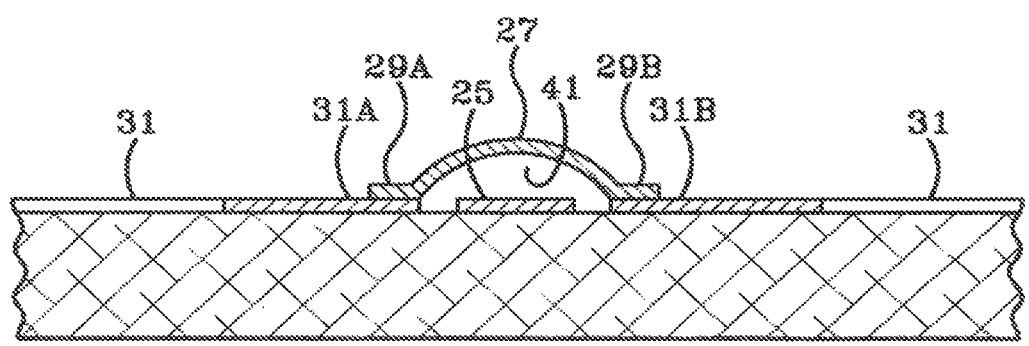
FIG. 4 illustrates an example cross-section view a preferred embodiment an air bridge.

FIGS. 3 and 4 illustrated the bias inductor I1. The bias inductor I1 has two levels of metal. One layer of metal is a transmission strip 25 layer of metal in combination with a spiraling octagonal shape metal 31 and the another layer of metal includes metallic air bridge metal structures 27 that air bridge over the transmission strip of 25 metal passing under the air bridge metal 27. There is actually a gap 41 between the air bridge metal 27 and the transmission strip 25. This gap can be filled with air, another gas or another material as understood by those of ordinary skill in the art. The air bridge metal 27 can include tab ends 29A, 29B that are used to connect it to ends 31A, 31B of the spiraled metal 31. The air bridge metal 27 actually arches upward from the first end 31A of the spiral metal 31 and has a curved arch that later curves downward toward the second end 31B of the spiral metal 31. A central portion 33 of the spiral of the bias inductor I1 is free of metal. In the preferred embodiment, the spiraled metal 31 almost makes five complete spirals around the central portion 33. Of course, in other embodiments, a different number of completed spirals may be desired.

It is desired to have an RF PA that has high bandwidth which means that the bias inductor I1 ideally has high impedances that don't interfere with the desired RE signal. Thus a large inductance is preferred, but a large inductance has a parasitic that is a shunt capacitance that limits the BW. However, the bias inductor of FIGS. 3 and 4 has an overall good geometry that does well to balance these competing design constraints. The conductors are thick and wide enough to handle the high current of the PA 1. In the preferred embodiment, the width (W) of the metal 31 used to form the octagonal shaped inductor I1 is about 40 microns wide with about 10 microns of gap (G) between the metal spirals. Of course these measurements can be other values.

Figure 5:
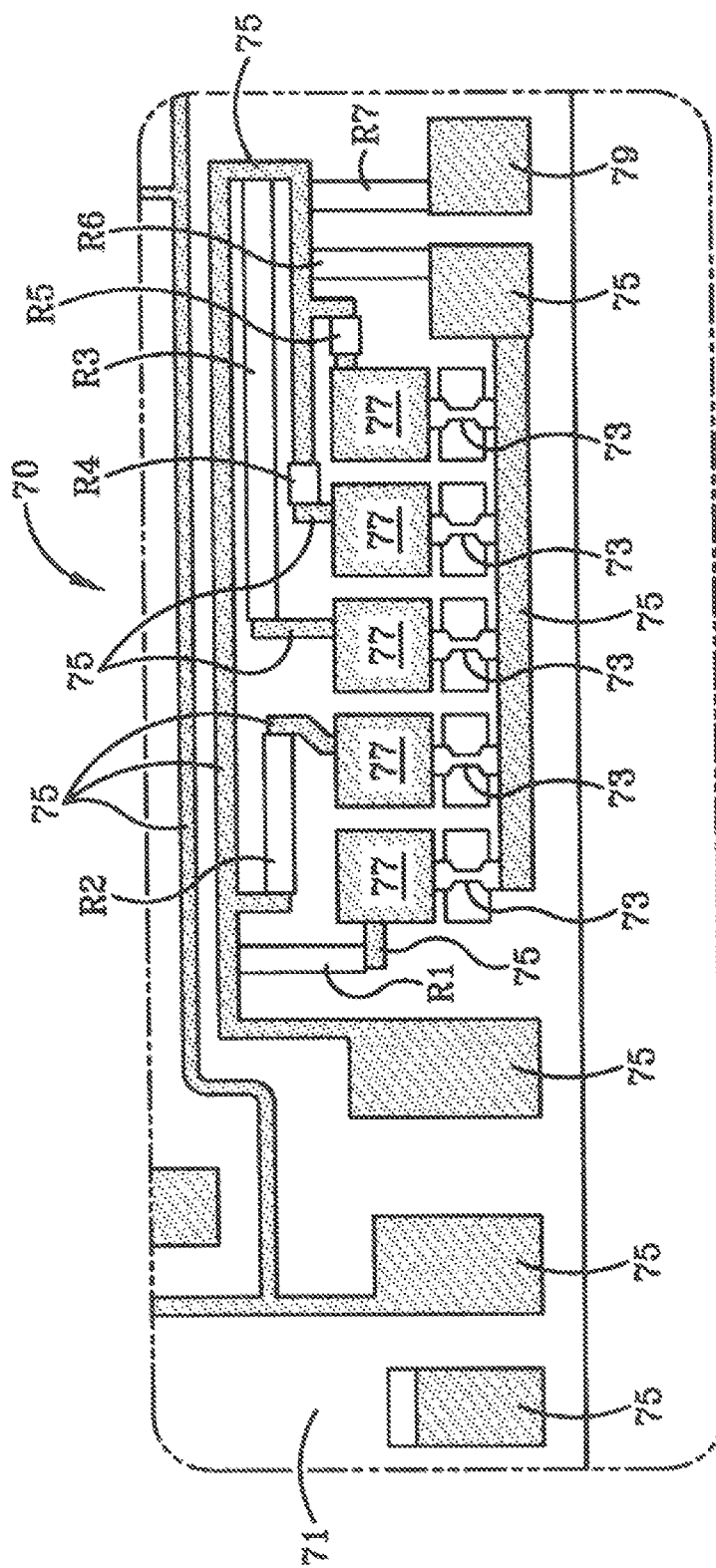
FIG. 5 illustrates an example top view of the metal layers of a FRAP circuit.

FIG. 5 illustrates the details of the fusible link resistive voltage divider "FRAP" device 70. Before the invention of this FRAP 70 one needed to apply a gate voltage to each individual chip and each individual chip needed to be tracked and the proper voltage applied to power it when it was implemented in a circuit. The FRAP device 70 is used to adjust the bias point of biasing circuits at the time of wafer testing. In the preferred embodiment, the FRAP 70 is on a GaN wafer 71 with conductive electrical routing and pad components. Five resistors R1-5 are provided and are connected to pad devices 77 that are connected to fusible links 73. In the preferred embodiment, these five resistors can be used to create about 32 different voltages ranging from −9 volts to about −2 volts but other ranges and voltage could be created in other embodiments. Two more resistors R6-7 are also provided that are always used to create a bias voltage. Resistor R7 is connected by a pad 79 to a reference voltage, that in the preferred embodiment is −9 volts. Resistor R6 is connected to the other ends of the fusible links by a pad at a ground voltage and conductive routing 75. In the preferred embodiment, the values of the resistors is as follows: R1=75 ohms, R2=150 ohms, R3=300 ohms, R4=600 ohms, R5=1200 ohms, R6=75 ohms and R7=80 ohms. Of course, in other embodiments the resistors can have different values and there may be fewer or more resistors used to implement the FRAP 70.

At the time of wafer testing, the bias voltage of the RF PA 1 is measured while it being applied to the RF PA circuits themselves. Next, a determination is made as to how much the bias voltage needs to he changed so that the RF PA 1 is biased to a proper value. A calculation is performed to determine which of the five resistors R1-5 connected to the fusible links 73 need to be used to create the proper bias voltage. Once that is determined, the fusible links 73 connected to just the unneeded resistors are broken so that just the required resistors participate in creating the proper bias voltage. In the preferred embodiment, the FRAP is a voltage divider circuit formed by resisters R1-R5. The fusible links 73 can be broken on the GaN wafer 71 by any method as understood by those of ordinary skill in the art. For example, one way they can be broken is applying a strong enough voltage across them to create the breakage.

The related and co-owned U.S. Applications entitled "TILE ARRAY PA MODULE USING QUADRATURE BALANCED PA MIMICS," "DIGITALLY CONTROLLED POWER AMPLIFIER," and "METHOD OF OPERATING A POWER AMPLIFIER IN CLASS F/INVERSE CLASS F," which are filed contemporaneously herewith, are incorporated as if fully rewritten.

In the foregoing description, certain terms have been used for brevity, clearness, and understanding. No unnecessary limitations are to be implied therefrom beyond the requirement of the prior art because such terms are used for descriptive purposes and are intended to be broadly construed. Therefore, the invention is not limited to the specific details, the representative embodiments, and illustrative examples shown and described. Thus, this application is intended to embrace alterations, modifications, and variations that fall within the scope of the appended claims.

Moreover, the description and illustration of the invention is an example and the invention is not limited to the exact details shown or described. References to "the preferred embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in the preferred embodiment" does not necessarily refer to the same embodiment, though it may.

What is claimed is:

1. A cascode power amplifier (PA) comprising:
   a common gate transistor with a gate connected to an biasing transmission line, a source connected to an output line and a drain;
   a common source transistor with a to connected to an RF input that receives an RF input signal, a source connected to the drain of the common gate transistor, and a drain connected to a feedback line;
   a first resistor between the biasing transmission line and the source of the common source transistor;
   a second resistor between the biasing transmission line and the feedback line, wherein the first transistor and the second transistor split a drain voltage of the common source transistor equally between the common gate transistor and the common source transistor;
   a third resistor and a first capacitor connected in series between the biasing transmission One and the feedback line; and
   a second capacitor connected in series between the biasing transmission line and feedback line configured to short an RF signal to ground.

2. The cascode PA of claim 1 where the values of the first resistor and the second resistor are between 4000 Ohms and 6000 Ohms, the value of the third resistor is between 250 and 400 Ohms, the value of the first capacitor is between 0.5 Pico farads (pF) and 1.5 pF, and where the value of the second capacitor is between 0.3 pF and 1.1 pF.

3. The cascade PA of claim 1 wherein the source of the common gate transistor is connected to ground.

4. The cascode PA of claim 1 wherein the biasing transmission line has width between 6 micro meters (um) and 14 um and has a length between 300 um and 500 um.

5. The cascade PA of claim 1 wherein the feedback line is a transmission line between the first resistor and the drain of the common source transistor that has a length that is between 3 and 6 times its length.

* * * * *